United States Patent [19]

Mijuskovic

[11] Patent Number: 5,206,609
[45] Date of Patent: Apr. 27, 1993

[54] CURRENT CONTROLLED OSCILLATOR WITH LINEAR OUTPUT FREQUENCY

[75] Inventor: Dejan Mijuskovic, Chandler, Ariz.
[73] Assignee: Motorola, Inc., Schaumburg, Ill.
[21] Appl. No.: 883,437
[22] Filed: May 15, 1992
[51] Int. Cl.$^5$ .............................................. H03B 5/24
[52] U.S. Cl. ..................................... 331/57; 331/177 R
[58] Field of Search ................ 331/57, 108 R, 108 B, 331/108 C, 177 R

[56] References Cited
U.S. PATENT DOCUMENTS
4,876,519  10/1989  Davis et al. .......................... 331/57

*Primary Examiner*—David Mis
*Attorney, Agent, or Firm*—Robert D. Atkins

[57] ABSTRACT

A current controlled ring oscillator use a plurality of serial amplifier stages with the output of the last stage connected to the input of the first stage. The ring oscillator maintains a linear output frequency over the control range by using a control circuit to compensate for variation in gate-source voltage of output clamping transistors. Moreover, switching nonlinearities can be removed by increasing the minimum value and decreasing the maximum value of the output waveform of each amplifier stage so as to compensate for time lost during the transition of the deadzone.

16 Claims, 2 Drawing Sheets

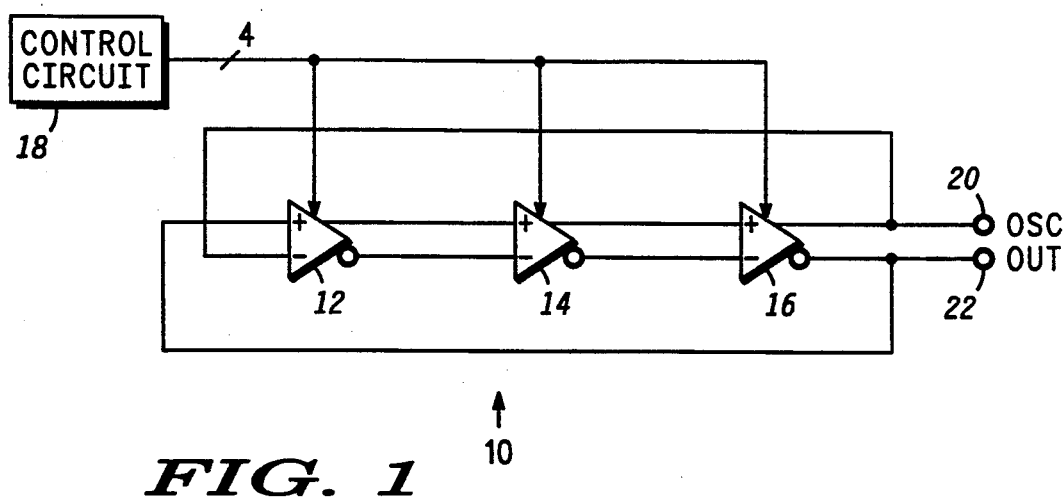
FIG. 1
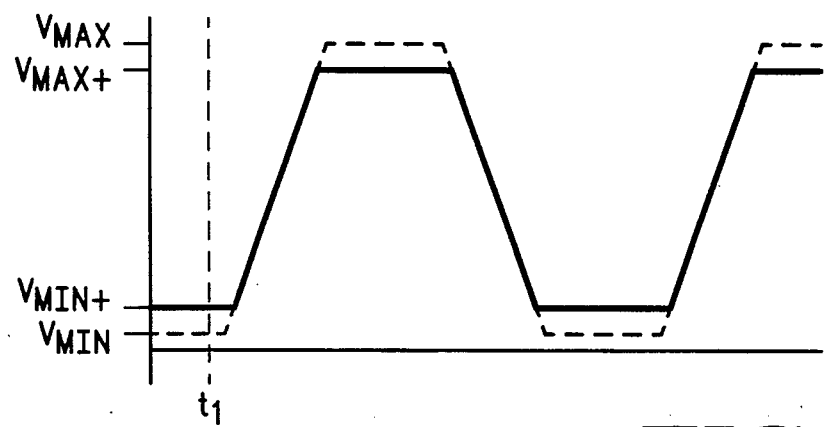
FIG. 3
FIG. 4
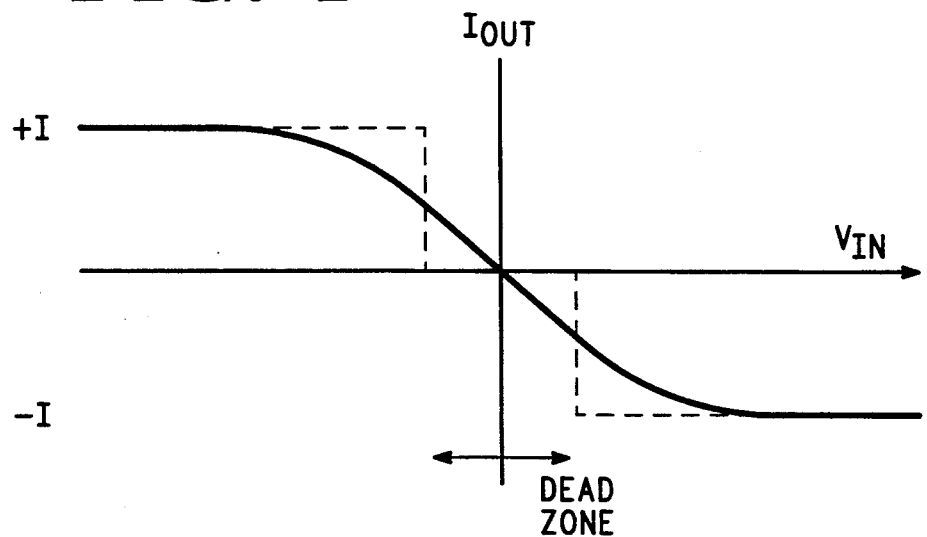

CURRENT CONTROLLED OSCILLATOR WITH LINEAR OUTPUT FREQUENCY

BACKGROUND OF THE INVENTION

The present invention relates in general to oscillators and, more particularly, to a current controlled ring oscillator having a linear output frequency over the control range.

Current controlled ring oscillators are commonly used in electronic circuit design, for example in phased lock loops, for providing an adjustable output frequency operating in the range of say 150 megahertz (Mhz). A common design for ring oscillators uses an odd number of serially connected differential amplifier stages with the differential outputs of one stage connected (+/+ and −/−) to the differential inputs of a subsequent stage. The differential outputs of the final stage are crossed-coupled (+/− and −/+) back to the inputs of the first stage. Thus, a three stage ring oscillator would have 60° of phase shift per amplifier stage followed by 180° due to the cross coupling between the output of the final stage back to the input of the first stage for providing 360° of total phase shift to cause the circuit to oscillate.

To adjust the output frequency, the ring oscillator often utilizes a current control feature in the amplifier stages. More current increases the frequency of the amplifier by charging internal capacitive nodes faster and increasing the transition rate of the amplifier stage. The higher the control current, the faster each amplifier stage transitions and the higher the output frequency of the ring oscillator.

Maintaining a linear output frequency over the current control range is important for accuracy and stability in applications such as phase lock loops. Unfortunately, conventional ring oscillators typically exhibit poor linearity in response to the control current. The current controlled gain of each amplifier stage, defined as the rate of change in frequency with respect to control current (df/di), can vary by as much as 60% over the control range. Ideally the rate of change in output frequency should remain constant over the control current range. Any non-linearity in the output frequency of the ring oscillator degrades the phase lock loop system performance.

Hence, a need exists for an improved current controlled ring oscillator with a linear output frequency as a function of control current.

SUMMARY OF THE INVENTION

Briefly stated, the invention comprises an oscillator circuit including a plurality of differential amplifier stages serially coupled output to input with a differential output of a last differential amplifier stage cross-coupled to a differential input of a first differential amplifier stage, and a control circuit having first and second outputs coupled to said plurality of differential amplifier stages for adjusting an output frequency of the oscillator circuit while maintaining linear operation of said output frequency over a control range.

BRIEF DESCRIPTION OF THE DRAWING

FIG. 1 is a simplified block diagram illustrating a current controlled ring oscillator;

FIGS. 3–4 are waveform plots useful in the explanation of the invention.

DETAILED DESCRIPTION OF THE PREFERRED EMBODIMENT

Figure 2:
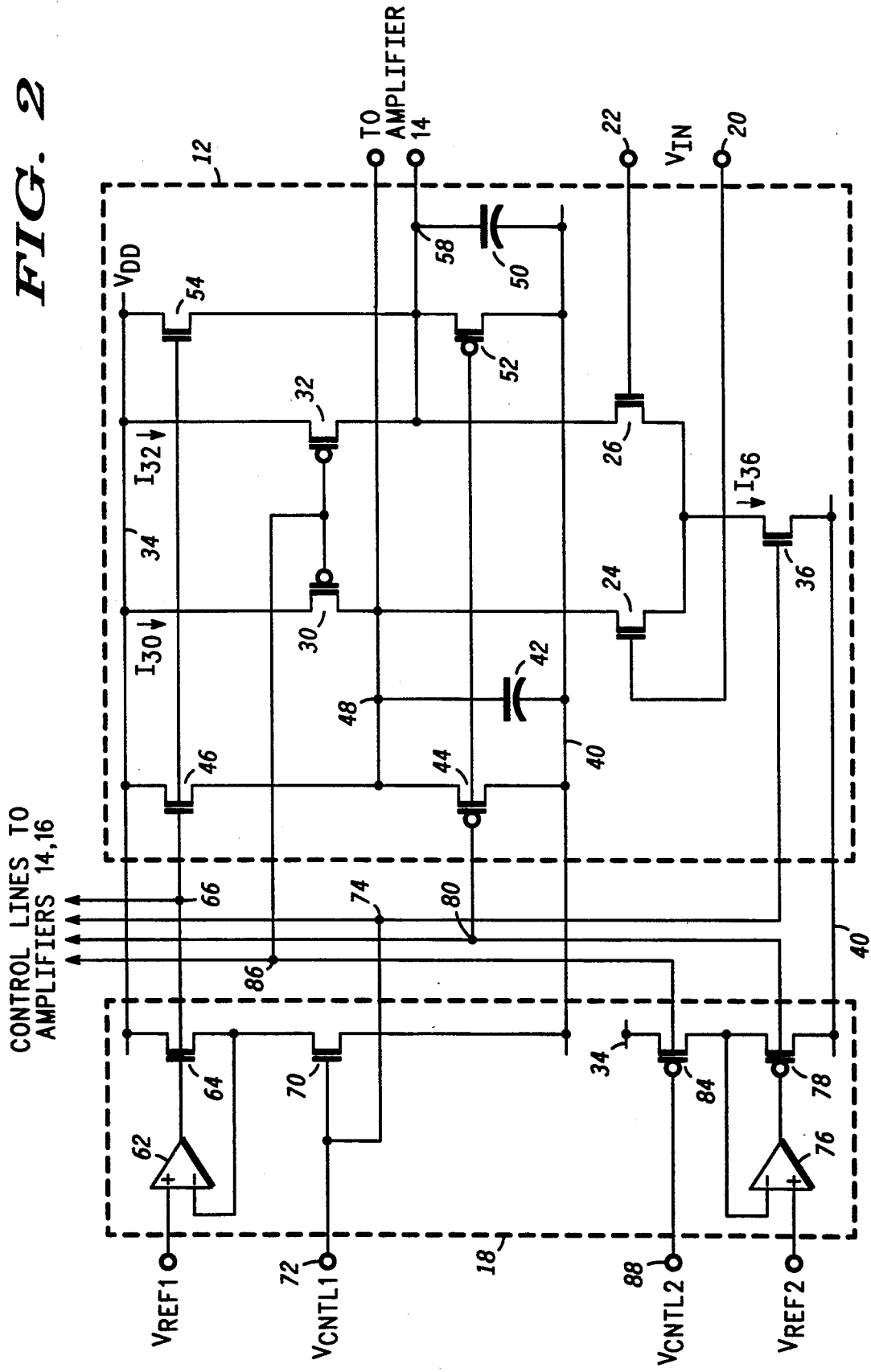
FIG. 2 is a schematic diagram illustrating an amplifier of FIG. 1 with control circuit.

Referring to FIG. 1, a current controlled ring oscillator circuit 10 is shown suitable for manufacturing as an integrated circuit using conventional integrated circuit processes. Differential amplifiers 12, 14 and 16 are serially coupled output to input with the differential outputs of amplifier 16 cross-coupled to the differential inputs of amplifier 12. Amplifiers 12, 14 and 16 each produce 60° of phase shift which, in combination with the 180° of phase shift achieved by crossing the outputs of amplifier 16 back to the inputs of amplifier 12, produces a full 360° phase shift causing circuit 10 to oscillate. Control circuit 18 provides current control to amplifiers 12–16 for adjusting the gain and output frequency of ring oscillator circuit 10. By properly controlling the gain of amplifiers 12–16, the rate of frequency change of the differential output oscillator signal OSC OUT remains linear over the control range. The differential oscillator signal OSC OUT may be taken at nodes 20 and 22.

Further detail of amplifier 12 is shown in FIG. 2 where nodes 20 and 22 provide a differential input voltage $V_{IN}$ at the gates of transistors 24 and 26. For amplifier 12, the differential input signal $V_{IN}$ is the oscillator signal OSC OUT. The drains of transistors 24 and 26 are coupled to the drains of transistors 30 and 32, respectively, while the sources of transistors 30 and 32 are coupled to power supply conductor 34 operating at a positive power supply potential such a $V_{DD}$ (5.0 volts). The sources of transistors 24 and 26 are coupled together to the drain of current source transistor 36 having a source coupled to power supply conductor 40 operating at ground potential. The drain of transistor 24 is also coupled through capacitor 42 to power supply conductor 40, and to the sources of transistors 44 and 46 at node 48. The drains of transistors 44 and 46 are coupled to power supply conductors 40 and 34, respectively.

In a similar manner, the drain of transistor 26 is coupled through capacitor 50 to power supply conductor 40, and to the sources of transistors 52 and 54 at node 58. The drains of transistors 52 and 54 are coupled to power supply conductors 40 and 34, respectively. Nodes 48 and 58 provide the differential outputs of amplifier 12 coupled to the differential inputs of amplifier 14. Amplifiers 14 and 16 follow a similar construction as described above for amplifier 12.

As part of the present invention, control circuit 18 provides control signals to amplifiers 12, 14 and 16. Differential amplifier 62 receives reference potential $V_{REF1}$ at its non-inverting input. The output of amplifier 62 is coupled to the gates of transistors 46, 54 and 64 at node 66. Transistor 64 also includes a drain coupled to power supply conductor 34, and a source coupled to the inverting input of amplifier 62 and to the drain of transistor 70. The gates of transistors 36 and 70 receive control signal $V_{CNTL1}$ applied at input 72. The drain of transistor 70 is coupled to power supply conductor 40. Control circuit 18 also includes differential amplifier 76 receiving reference potential $V_{REF2}$ at its non-inverting input. The output of amplifier 76 is coupled to the gates of transistors 44, 52 and 78 at node 80. The drain of transistor 78 is coupled to power supply conductor 40 while its source is coupled to the inverting input of amplifier 76 and to the source of transistor 84. The gates of transistors 30, 32 and 84 receive control signal $V_{CNTL2}$ applied at input 88. The drain of transistor 84 is coupled to power supply conductor 34. Transistors 70 and 84 operate as current source in response to control signals $V_{CNTL1}$ and $V_{CNTL2}$, respectively.

The operation of oscillator circuit 10 proceeds as follows. Transistors 24 and 26 of amplifier 12 form a differential pair operating in response to the differential input signal $V_{IN}$ from nodes 20–22. The gain of amplifier 12, and accordingly the output frequency of the differential oscillator signal OSC OUT, is controlled by control signals $V_{CNTL1}$ and $V_{CNTL2}$ applied at the gates of transistor 36 and transistors 30–32, respectively. Control signal $V_{CNTL2}$ sets the current flow through transistors 30–32 ($I_{30}=I_{32}$), while control signal $V_{CNTL1}$ biases current source transistor 36 to conduct current $I_{36}=I_{30}+I_{32}$. Larger control signals $V_{CNTL1}$ and $V_{CNTL2}$ increase currents $I_{30}$, $I_{32}$, and $I_{36}$ thereby charging and discharging nodes 48–50 at a faster rate with more gain in amplifiers 12–16 which increases the transitions times and output frequency of oscillator 10.

When the voltage at node 20 is less than the voltage at node 22, transistor 24 is off and capacitor 42 charges with current $I_{30}$ from transistor 30. Ideally, the voltage at node 48 increases with the rate $dV_{48}/dt=I_{30}/C_{42}$, where $C_{42}$ is the value of capacitor 42. As capacitor 42 charges, transistor 44 begins to sink current $I_{30}$ to limit the maximum voltage at node 48 to $V_{48MAX}=V_{80}+V_{GS44}$, where $V_{80}$ is the voltage at node 80 and $V_{GS44}$ is the gate-source voltage of transistor 44. The higher voltage at node 22 turns on transistor 26 which sinks current $I_{36}$. Current $I_{32}$ provides half of the current sunk by transistors 26 and 36 while the remainder is sunk from capacitor 50. Therefore, the voltage at node 58 decreases at a rate $dV_{58}/dt=-I_{32}/C_{50}$, where $C_{50}$ is the value of capacitor 50. As capacitor 50 discharges, transistor 54 supplies a clamping current to limit the minimum voltage at node 58 to $V_{58MIN}=V_{66}-V_{GS54}$, where $V_{66}$ is the voltage at node 66 and $V_{GS54}$ is the gate-source voltage of transistor 54.

Conversely, when the voltage at node 20 is greater than the voltage at node 22, transistor 26 is off and capacitor 50 charges with current $I_{32}$ from transistor 32. The voltage at node 58 increases at a rate $dV_{58}/dt=I_{32}/C_{50}$. As capacitor 50 charges, transistor 52 begins to sink current $I_{32}$ to limit the maximum voltage at node 58 to $V_{58MAX}=V_{80}+V_{GS52}$, where $V_{GS52}$ is the gate-source voltage of transistor 52. The higher voltage at node 20 turns on transistor 24 which conducts current $I_{36}$. Current $I_{30}$ and the discharge of capacitor 50 provide current for transistors 24 and 36. The voltage at node 48 decreases with the rate $dV_{48}/dt=-I_{30}/C_{42}$. As capacitor 42 discharges, transistor 46 supplies a clamping current to limit the minimum voltage at node 48 to $V_{48MIN}=V_{66}-V_{GS46}$, where $V_{GS46}$ is the gate-source voltage of transistor 46.

The output waveform of amplifier 12 is shown in FIG. 3 as the difference between the voltages at nodes 48 and 58, $V_{48}-V_{58}$. Clamping transistors 46 and 54 limit the minimum voltages at nodes 48 and 58 to $V_{66}-V_{GS46}$ and $V_{66}-V_{GS54}$, respectively. Likewise, clamping transistors 44 and 52 limit the maximum voltages at nodes 48 and 58 to $V_{80}+V_{GS44}$ and $V_{80}+V_{GS52}$, respectively. When transistor 26 is conducting, $V_{MAX}=V_{48MAX}-V_{58MIN}$, and when transistor 24 is conducting, $V_{MIN}=V_{48MIN}-V_{58MAX}$, see FIG. 3.

The gain of amplifier 12 may be expressed as:

$$\frac{dF}{dI} = \frac{A}{C} (V_{MAX} - V_{MIN}) \quad (1)$$

where F is frequency of the differential signal across nodes 48 and 58, I may be either currents $I_{30}$ or $I_{32}$, A is a constant, C is the value of capacitor 42 or 50, $V_{MAX}$ is the maximum differential voltage across nodes 48 and 58, and $V_{MIN}$ is minimum differential voltage across nodes 48 and 58.

Amplifier 12 has two inherent sources of non-linear operation. First, when the output frequency changes with the control currents $I_{30}$, $I_{32}$, and $I_{36}$ via control signals $V_{CNTL1}$ and $V_{CNTL2}$, the clamping currents conducted by transistors 44, 46, 52 and 54 also change proportionally which increases or decreases their gate-source voltages. Variation in $V_{GS}$ of transistors 44, 46, 52 and 54 due to control current changes the gain by equation (1) which adversely effects the linearity of the output frequency of amplifier 12.

The gate-source voltage of an MOS transistor is given as $V_{GS}=V_T+V_{SAT}(I)$, where $V_T$ is the threshold voltage and $V_{SAT}(I)$ is the additional voltage needed to conduct current I. As part of the present invention, control circuit 18 provides control signals at nodes 66 add 80 for transistors 44, 46, 52 and 54 to compensate for the non-linear gain changes by maintaining $V_{MAX}$ and $V_{MIN}$ constant as per equation (1).

Transistor 70 operating in response to control signal $V_{CNTL1}$ conducts a current through transistor 64 proportional to current $I_{30}$ or $I_{32}$. Therefore, the gate-source voltage of transistor 64 ($V_{GS64}$) is also proportional to the gate-source voltage of transistors 46 and 54 when the latter transistors clamp. Likewise, transistor 84 operating in response to control signal $V_{CNTL2}$ conducts a current through transistor 78 equal to current $I_{30}$ or $I_{32}$. The gate-source voltage of transistor 78 is thus maintained the same as the gate-source voltage of transistors 44 and 52 when the latter transistors clamp.

The following values of $V_{66}$ and $V_{80}$ keep $V_{MAX}$ and $V_{MIN}$ constant:

$$V_{66}=V_{REF1}+V_T+V_{SAT}(I_{54})=V_{REF1}+V_T+V_{SAT}(B*I_{32}) \quad (2)$$

$$V_{80}=V_{REF2}-V_T-V_{SAT}(I_{52})=V_{REF2}-V_T-V_{SAT}(B*I_{32}) \quad (3)$$

where B=proportionality constant less than unity between currents $I_{32}$ and $I_{54}$.

For example, assume control signals $V_{CNTL1}$ and $V_{CNTL2}$ are increased for a higher output frequency of oscillator 10. The gate-source voltages of transistors 44, 46, 52 and 54 increase because each must supply a greater clamping current for the larger current $I_{36}$. The currents through transistors 70 and 84 increase by the same control signals $V_{CNTL1}$ and $V_{CNTL2}$ such that transistors 64 and 78 develop similar gate-source voltage as transistors 44 and 46, and transistors 52 and 54, respectively. Differential amplifier 62 senses the increase in voltage at its inverting input and increases its output voltage accordingly. The voltage $V_{66}$ increases to compensate for the larger gate-source voltages of transistors 46 and 54. Likewise, differential amplifier 76 senses an increase in voltage at its inverting input and decreases its output voltage accordingly. The voltage $V_{80}$ decreases to compensate for the larger gate-source voltages of transistors 44 and 52. Thus, by controlling $V_{66}$ and $V_{80}$ at the proper levels, $V_{MAX}$ and $V_{MIN}$ are held at constant values over the range of gain control currents $I_{30}$, $I_{32}$ and $I_{36}$ to maintain linear operation for the output frequency of amplifier 12.

A second source of non-linearity operation occurs during the short switching time when transistors 24 and 26 both conduct simultaneously causing small currents to flow through capacitors 42 and 50. FIG. 4 represents the current flow into capacitors 42 or 50 as function of the differential input voltage $V_{IN}$. However, the desired current values of $+I/-I$ cannot be reached for small values of $V_{IN}$. Since the voltage across a capacitor is determined by integrating the capacitive load current, the same charging/discharging times for capacitors 42 and 50 may be achieved by currents following the dashed line in FIG. 4, given the same areas under solid and dashed lines. This simplified model allows analysis of the circuit in terms of a hypothetical 'dead zone' during which no current is delivered to the load, and the remaining time, when capacitors 42 and 50 are charged/discharged with $+I/-I$.

The dead zone is proportional to the input voltage overdrive needed to completely switch the differential transistor pair 24–26. The overdrive voltage depends upon the control current expressed as $V_{DEAD} = K^*Vsat(I_{36})$, where K is constant, and $Vsat(I_{36})$ is excess voltage of transistors 24–26 while conducting current $I_{36}$. The dead zone time can be compensated for by increasing $V_{48MIN}$ and $V_{58MIN}$ by $V_{DEAD}$ which is a function of control current $I_{36}$.

To achieve the $V_{DEAD}$ offset for $V_{48MIN}$ and $V_{58MIN}$, the size of transistor 70 is increased such that the same magnitude of control voltage $V_{CNTL1}$ causes transistor 70 to conduct proportionally more current than transistors 30–32 by a predetermined factor X. Accordingly, $V_{GS64}$ is proportionally greater than $V_{GS46}$ and $V_{GS54}$. Differential amplifier 62 drives the gate of transistor 64 higher to maintain the voltage at the source of transistor 64 substantially equal to $V_{REF1}$. Thus, $V_{66}$ increases by the change in $V_{GS64}$, whereby:

$$V_{48MIN+} = V_{REF1} + V_{GS64} - V_{GS46} \quad (4)$$
$$= V_{48MIN} + V_{DEAD}$$

$$V_{58MIN+} = V_{REF1} + V_{GS64} - V_{GS54} \quad (5)$$
$$= V_{58MIN} + V_{DEAD}$$

The previous discussion where $V_{GS64}$ is made proportional to $V_{GS46}$ and $V_{GS54}$ is now more completely understood in that the minimum voltage at nodes 48 and 58 with the $V_{DEAD}$ offset ($V_{48MIN+}$, $V_{58MIN+}$) increases by the difference of $V_{GS64} - V_{GS46}$ and $V_{GS64} - V_{GS54}$, respectively, due to the difference in device size between transistor 70 and transistors 30–32. The predetermined factor X by which the size of transistor 70 is increased is chosen such that $V_{GS64} - V_{GS46} = K^*V_{SAT}(I_{36}) = V_{DEAD}$. $V_{48MAX}$ and $V_{58MAX}$ as derived from $V_{80}$ remain unchanged. Accordingly as shown in FIG. 3:

$$V_{MAX+} = V_{48MAX} - V_{58MIN+} \quad (6)$$
$$= V_{MAX} - V_{DEAD}$$

-continued
$$V_{MIN+} = V_{48MIN+} - V_{58MAX} \quad (7)$$
$$= V_{MIN} + V_{DEAD}$$

To further illustrate how increasing the minimum amplitude and decreasing the maximum amplitude of the output waveform improves linearity, consider the following equations where the frequency of the oscillator signal OSC OUT is given as:

$$f = \frac{1}{6\left(\Delta v\left(\frac{C}{I}\right) + V_{DEAD}\left(\frac{C}{I}\right)\right)} \quad (8)$$

where $\Delta V = V_{MAX+} - V_{MIN+}$. The ratio I/C represents the slope of the output waveform ($T = 1/f = \Delta V \cdot C/I$). The factor of six follows from the two passes through the three amplifier stages necessary for one complete cycle of oscillator circuit 10. Recall that $V_{DEAD}$ is a function of control current $I_{36}$. Thus, the goal is to eliminate $V_{DEAD}$ from equation (8) to cancel the non-linear effect of control current and maintain the output frequency linear over the control range.

$$f = \frac{I}{6C\left(\frac{V_{MAX+} - V_{MIN+}}{2} + V_{DEAD}\right)} \quad (9)$$

$$f = \frac{I}{3C((V_{MAX} - V_{DEAD}) - (V_{MIN} + V_{DEAD}) + 2^*V_{DEAD})}$$

The $V_{DEAD}$ terms cancel leaving:

$$f = \frac{I}{3C(V_{MAX} - V_{MIN})} \quad (10)$$

Taking the derivation of equation (10) yields equation (1), where $A = \frac{1}{3}$. Hence, the ultimate effect is to eliminate the non-linearities introduced by switching overlap of transistors 24–26 during transitions by increasing the $V_{MIN}$ level and reducing the $V_{MAX}$ level. Each amplifier stage receives an input waveform sufficiently offset to compensate for time lost during the transition of the deadzone.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An oscillator circuit, comprising:
    a plurality of differential amplifier stages serially coupled output to input with a differential output of a last differential amplifier stage cross-coupled to a differential input of a first differential amplifier stage; and
    a control circuit having first and second outputs coupled to said plurality of differential amplifier stages for adjusting an output frequency of the oscillator circuit while maintaining linear operation of said output frequency over a control range, said control circuit including,
        (a) a first differential amplifier having first and second inputs and an output, said first input receiving a first reference signal, said output providing said first output of said control circuit, (b) a first transistor having a gate, a drain and a source, said gate being coupled to said output of said first differential amplifier, said drain being coupled to a first power supply conductor, said source being coupled to said second input of said first differential amplifier, and (c) a second transistor having a gate, a drain and a source, said gate receiving a first control signal, said source being coupled to a second power supply conductor, said drain being coupled to said source of said first transistor.

2. The oscillator circuit of claim 1 wherein said control circuit further includes:

a second differential amplifier having first and second inputs and an output, said first input receiving a second reference signal, said output providing said second output of said control circuit;

a third transistor having a gate, a drain and a source, said gate being coupled to said output of said second differential amplifier, said drain being coupled to said second power supply conductor, said source being coupled to said second input of said second differential amplifier; and a fourth transistor having a gate, a drain and a source, said gate receiving a second control signal, said source being coupled to said first power supply conductor, said drain being coupled to said source of said third transistor.

3. The oscillator circuit of claim 2 wherein one of said differential amplifier stages includes:

a fifth transistor having a gate, a drain and a source;

a sixth transistor having a gate, a drain and a source, said gates of said fifth and sixth transistors receiving a differential input signal;

a seventh transistor having a gate, a drain and a source, said gate being coupled to said second output of said control circuit, said source being coupled to said second power supply conductor, said drain being coupled to said sources of said fifth and sixth transistors;

an eighth transistor having a gate, a drain and a source, said source being coupled to said first power supply conductor, said drain being coupled to said drain of said fifth transistor for providing a first output of said one of said differential amplifier stages; and a ninth transistor having a gate, a drain and a source, said gates of said eighth and ninth transistors receiving said first control signal, said source being coupled to said first power supply conductor, said drain being coupled to said drain of said sixth transistor for providing a second output of said one of said differential amplifier stages.

4. The oscillator circuit of claim 3 wherein said one of said differential amplifier stages further includes:

a tenth transistor having a gate, a drain and a source, said gate being coupled to said first output of said control circuit, said drain being coupled to said first power supply conductor, said source being coupled to said first output of said one of said differential amplifier stages;

an eleventh transistor having a gate, a drain and a source, said gate being coupled to said second output of said control circuit, said drain being coupled to said second power supply conductor, said source being coupled to said first output of said one of said differential amplifier stages; and a first capacitor coupled between said first output of said one of said differential amplifier stages and said second power supply conductor.

5. The oscillator circuit of claim 4 wherein said one of said differential amplifier stages further includes:

a twelfth transistor having a gate, a drain and a source, said gate being coupled to said first output of said control circuit, said drain being coupled to said first power supply conductor, said source being coupled to said second output of said one of said differential amplifier stages;

a thirteenth transistor having a gate, a drain and a source, said gate being coupled to said second output of said control circuit, said drain being coupled to said second power supply conductor, said source being coupled to said second output of said one of said differential amplifier stages; and a second capacitor coupled between said second output of said one of said differential amplifier stages and said second power supply conductor.

6. An oscillator circuit, comprising:

a plurality of differential amplifier stages serially coupled output to input with a differential output of a last differential amplifier stage cross-coupled to a differential input of a first differential amplifier stage, said plurality of differential amplifier stages including first and second control inputs;

a first differential amplifier having first and second inputs and an output, said first input receiving a first reference signal, said output being coupled to said first control input of said plurality of differential amplifier stages;

a first transistor having a gate, a drain and a source, said gate being coupled to said output of said first differential amplifier, said drain being coupled to a first power supply conductor, said source being coupled to said second input of said first differential amplifier;

first current supply means having an output coupled to said source of said first transistor and having a control input coupled for receiving a first control signal;

a second differential amplifier having first and second inputs and an output, said first input receiving a second reference signal, said output being coupled to a second control input of said plurality of differential amplifier stages;

a second transistor having a gate, a drain and a source, said gate being coupled to said output of said second differential amplifier, said drain being coupled to a second power supply conductor, said source being coupled to said second input of said second differential amplifier; and second current supply means having an output coupled to said source of said second transistor and having a control input coupled for receiving a second control signal.

7. The oscillator circuit of claim 6 wherein said first current supply means includes a third transistor having a gate, a drain and a source, said gate receiving said first control signal, said source being coupled to said second power supply conductor, said drain being coupled to said source of said first transistor.

8. The oscillator circuit of claim 7 wherein said second current supply means includes a fourth transistor having a gate, a drain and a source, said gate receiving said second control signal, said source being coupled to said first power supply conductor, said drain being coupled to said source of said third transistor.

9. The oscillator circuit of claim 8 wherein one of said differential amplifier stages includes:
   a fifth transistor having a gate, a drain and a source;
   a sixth transistor having a gate, a drain and a source, said gates of said fifth and sixth transistors receiving a differential input signal;
   a seventh transistor having a gate, a drain and a source, said gate being coupled to said second control input, said source being coupled to said second power supply conductor, said drain being coupled to said sources of said fifth and sixth transistors;
   an eighth transistor having a gate, a drain and a source, said source being coupled to said first power supply conductor, said drain being coupled to said drain of said fifth transistor for providing a first output of said one of said differential amplifier stages; and
   a ninth transistor having a gate, a drain and a source, said gates of said eighth and ninth transistors receiving said first control signal, said source being coupled to said first power supply conductor, said drain being coupled to said drain of said sixth transistor for providing a second output of said one of said differential amplifier stages.

10. The oscillator circuit of claim 9 wherein said one of said differential amplifier stages further includes:
    a tenth transistor having a gate, a drain and a source, said gate being coupled to said first control input, said drain being coupled to said first power supply conductor, said source being coupled to said first output of said one of said differential amplifier stages;
    an eleventh transistor having a gate, a drain and a source, said gate being coupled to said second control input, said drain being coupled to said second power supply conductor, said source being coupled to said first output of said one of said differential amplifier stages; and
    a first capacitor coupled between said first output of said one of said differential amplifier stages and said second power supply conductor.

11. The oscillator circuit of claim 10 wherein said one of said differential amplifier stages further includes:
    a twelfth transistor having a gate, a drain and a source, said gate being coupled to said first control input, said drain being coupled to said first power supply conductor, said source being coupled to said second output of said one of said differential amplifier stages;
    a thirteenth transistor having a gate, a drain and a source, said gate being coupled to said second control input, said drain being coupled to said second power supply conductor, said source being coupled to said second output of said one of said differential amplifier stages; and
    a second capacitor coupled between said second output of said one of said differential amplifier stages and said second power supply conductor.

12. An integrated oscillator circuit, comprising:
    a plurality of differential amplifier stages serially coupled output to input with a differential output of a last differential amplifier stage cross-coupled to a differential input of a first differential amplifier stage; and
    a control circuit having first and second outputs coupled to said plurality of differential amplifier stages for adjusting an output frequency of the oscillator circuit while maintaining linear operation of said output frequency over a control range, said control circuit including,
    (a) a first differential amplifier having first and second inputs and an output, said first input receiving a first reference signal, said output providing said first output of said control circuit,
    (b) a first transistor having a gate, a drain and a source, said gate being coupled to said output of said first differential amplifier, said drain being coupled to a first power supply conductor, said source being coupled to said second input of said first differential amplifier, and
    (c) a second transistor having a gate, a drain and a source, said gate receiving a first control signal, said source being coupled to a second power supply conductor, said drain being coupled to said source of said first transistor.

13. The integrated oscillator circuit of claim 12 wherein said control circuit further includes:
    a second differential amplifier having first and second inputs and an output, said first input receiving a second reference signal, said output providing said second output of said control circuit;
    a third transistor having a gate, a drain and a source, said gate being coupled to said output of said second differential amplifier, said drain being coupled to said second power supply conductor, said source being coupled to said second input of said second differential amplifier; and
    a fourth transistor having a gate, a drain and a source, said gate receiving a second control signal, said source being coupled to said first power supply conductor, said drain being coupled to said source of said third transistor.

14. The integrated oscillator circuit of claim 13 wherein one of said differential amplifier stages includes:
    a fifth transistor having a gate, a drain and a source;
    a sixth transistor having a gate, a drain and a source, said gates of said fifth and sixth transistors receiving a differential input signal;
    a seventh transistor having a gate, a drain and a source, said gate being coupled to said second output of said control circuit, said source being coupled to said second power supply conductor, said drain being coupled to said sources of said fifth and sixth transistors;
    an eighth transistor having a gate, a drain and a source, said source being coupled to said first power supply conductor, said drain being coupled to said drain of said fifth transistor for providing a first output of said one of said differential amplifier stages; and
    a ninth transistor having a gate, a drain and a source, said gates of said eighth and ninth transistors receiving said first control signal, said source being coupled to said first power supply conductor, said drain being coupled to said drain of said sixth transistor for providing a second output of said one of said differential amplifier stages.

15. The integrated oscillator circuit of claim 14 wherein said one of said differential amplifier stages further includes:

a tenth transistor having a gate, a drain and a source, said gate being coupled to said first output of said control circuit, said drain being coupled to said first power supply conductor, said source being coupled to said first output of said one of said differential amplifier stages;

an eleventh transistor having a gate, a drain and a source, said gate being coupled to said second output of said control circuit, said drain being coupled to said second power supply conductor, said source being coupled to said first output of said one of said differential amplifier stages; and a first capacitor coupled between said first output of said one of said differential amplifier stages and said second power supply conductor.

16. The integrated oscillator circuit of claim 15 wherein said one of said differential amplifier stages further includes:

a twelfth transistor having a gate, a drain and a source, said gate being coupled to said first output of said control circuit, said drain being coupled to said first power supply conductor, said source being coupled to said second output of said one of said differential amplifier stages;

a thirteenth transistor having a gate, a drain and a source, said gate being coupled to said second output of said control circuit, said drain being coupled to said second power supply conductor, said source being coupled to said second output of said one of said differential amplifier stages; and a second capacitor coupled between said second output of said one of said differential amplifier stages and said second power supply conductor.

* * * * *